United States Patent
Sengers et al.

(10) Patent No.: US 9,804,509 B2
(45) Date of Patent: *Oct. 31, 2017

(54) LITHOGRAPHIC APPARATUS AND DEVICE MANUFACTURING METHOD

(71) Applicant: ASML NETHERLANDS B.V., Veldhoven (NL)

(72) Inventors: Timotheus Franciscus Sengers, 's-Hertogenbosch (NL); Sjoerd Nicolaas Lambertus Donders, 's-Hertogenbosch (NL); Hans Jansen, Eindhoven (NL); Arjen Boogaard, Deventer (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 15/452,403

(22) Filed: Mar. 7, 2017

(65) Prior Publication Data
US 2017/0176876 A1    Jun. 22, 2017

Related U.S. Application Data

(63) Continuation of application No. 14/941,320, filed on Nov. 13, 2015, now Pat. No. 9,594,308, which is a
(Continued)

(30) Foreign Application Priority Data

Jul. 24, 2003 (EP) .................................. 03255228

(51) Int. Cl.
G03B 27/42 (2006.01)
G03F 7/20 (2006.01)

(52) U.S. Cl.
CPC ...... G03F 7/70866 (2013.01); G03F 7/70341 (2013.01)

(58) Field of Classification Search
CPC ............. G03F 7/70341; G03F 7/70591; G03F 7/7085; G03F 7/7095
(Continued)

(56) References Cited

U.S. PATENT DOCUMENTS 3,560,812 A  2/1971 Hall et al.
3,573,975 A  4/1971 Dhaka et al.
(Continued)

FOREIGN PATENT DOCUMENTS

CN    100568103    12/2009
DE    206 607      2/1984
(Continued)

OTHER PUBLICATIONS

M. Switkes et al., "Immersion Lithography at 157 nm", MIT Lincoln Lab, Orlando 2001-1, Dec. 17, 2001.
(Continued)

*Primary Examiner* — Peter B Kim
(74) *Attorney, Agent, or Firm* — Pillsbury Winthrop Shaw Pittman LLP

(57) ABSTRACT

In a lithographic projection apparatus, a liquid supply system maintains liquid in a space between a projection system of the lithographic projection apparatus and a substrate. A sensor positioned on a substrate table, which holds the substrate, is configured to be exposed to radiation when immersed in liquid (e.g., under the same conditions as the substrate will be exposed to radiation). By having a surface of an absorption element of the sensor, that is to be in contact with liquid, formed of no more than one metal type, long life of the sensor may be obtained.

20 Claims, 5 Drawing Sheets

Related U.S. Application Data continuation of application No. 14/262,295, filed on Apr. 25, 2014, now Pat. No. 9,213,247, which is a continuation of application No. 12/478,552, filed on Jun. 4, 2009, now Pat. No. 8,711,333, which is a continuation of application No. 11/641,730, filed on Dec. 20, 2006, now Pat. No. 7,557,901, which is a continuation of application No. 10/888,514, filed on Jul. 12, 2004, now Pat. No. 7,184,122.

(58) Field of Classification Search
USPC .................................................. 355/30, 53
See application file for complete search history.

(56) References Cited

U.S. PATENT DOCUMENTS

| | | |
|---|---|---|
| 3,648,587 A | 3/1972 | Stevens |
| 4,346,164 A | 8/1982 | Tabarelli et al. |
| 4,390,273 A | 6/1983 | Loebach et al. |
| 4,396,705 A | 8/1983 | Akeyama et al. |
| 4,480,910 A | 11/1984 | Takanashi et al. |
| 4,509,852 A | 4/1985 | Tabarelli et al. |
| 4,510,436 A | 4/1985 | Raymond |
| 5,040,020 A | 8/1991 | Rauschenbach et al. |
| 5,121,256 A | 6/1992 | Corle et al. |
| 5,479,049 A | 12/1995 | Aoki et al. |
| 5,610,683 A | 3/1997 | Takahashi |
| 5,712,710 A | 1/1998 | Karakus et al. |
| 5,715,039 A | 2/1998 | Fukuda et al. |
| 5,825,043 A | 10/1998 | Suwa |
| 5,900,354 A | 5/1999 | Batchelder |
| 6,191,429 B1 | 2/2001 | Suwa |
| 6,236,634 B1 | 5/2001 | Lee et al. |
| 6,259,099 B1 | 7/2001 | Foulon et al. |
| 6,560,032 B2 | 5/2003 | Hatano |
| 6,576,972 B1 | 6/2003 | Parsons |
| 6,600,547 B2 | 7/2003 | Watson et al. |
| 6,603,130 B1 | 8/2003 | Bisschops et al. |
| 6,633,365 B2 | 10/2003 | Suenaga |
| 6,952,253 B2 | 10/2005 | Lof et al. |
| 6,954,256 B2 | 10/2005 | Flagello et al. |
| 7,009,682 B2 | 3/2006 | Bleeker |
| 7,050,146 B2 | 5/2006 | Duineveld et al. |
| 7,075,616 B2 | 7/2006 | Derksen et al. |
| 7,081,943 B2 | 7/2006 | Lof et al. |
| 7,184,122 B2 | 2/2007 | Sengers et al. |
| 7,193,232 B2 | 3/2007 | Lof et al. |
| 7,199,858 B2 | 4/2007 | De Smit et al. |
| 7,213,963 B2 | 5/2007 | Lof et al. |
| 7,326,522 B2 | 2/2008 | Dierichs |
| 7,359,030 B2 | 4/2008 | Simon et al. |
| 7,394,521 B2 | 7/2008 | Van Santen et al. |
| 7,486,380 B2 | 2/2009 | Hazelton et al. |
| 7,557,901 B2 | 7/2009 | Sengers et al. |
| 8,711,333 B2 | 4/2014 | Sengers et al. |
| 9,213,247 B2 | 12/2015 | Sengers et al. |
| 9,594,308 B2 * | 3/2017 | Sengers .............. G03F 7/70341 |
| 2002/0020821 A1 | 2/2002 | Van Santen et al. |
| 2002/0037461 A1 | 3/2002 | Van Der Werf et al. |
| 2002/0163629 A1 | 11/2002 | Switkes et al. |
| 2003/0123040 A1 | 7/2003 | Almogy |
| 2003/0174408 A1 | 9/2003 | Rostalski et al. |
| 2004/0000627 A1 | 1/2004 | Schuster |
| 2004/0021844 A1 | 2/2004 | Suenaga |
| 2004/0075895 A1 | 4/2004 | Lin |
| 2004/0109237 A1 | 6/2004 | Epple et al. |
| 2004/0119954 A1 | 6/2004 | Kawashima et al. |
| 2004/0125351 A1 | 7/2004 | Krautschik et al. |
| 2004/0160582 A1 | 8/2004 | Lof et al. |
| 2005/0078287 A1 | 4/2005 | Sengers et al. |
| 2005/0110973 A1 | 5/2005 | Streefkerk et al. |
| 2005/0132914 A1 | 6/2005 | Mulkens et al. |
| 2005/0175776 A1 | 8/2005 | Streefkerk et al. |
| 2005/0219490 A1 | 10/2005 | Owa |
| 2007/0242242 A1 | 10/2007 | Nagasaka et al. |
| 2008/0180688 A1 | 7/2008 | Mengel et al. |
| 2008/0252876 A1 | 10/2008 | Mengel et al. |

FOREIGN PATENT DOCUMENTS

| | | |
|---|---|---|
| DE | 221 563 | 4/1985 |
| DE | 224448 | 7/1985 |
| DE | 242880 | 2/1987 |
| EP | 0 023 231 | 2/1981 |
| EP | 0 418 427 | 3/1991 |
| EP | 0 834 773 A2 | 4/1998 |
| EP | 0 834 773 A3 | 7/1999 |
| EP | 1 039 511 | 9/2000 |
| EP | 1 420 300 | 5/2004 |
| FR | 2474708 | 7/1981 |
| JP | 58-202448 | 11/1983 |
| JP | 62-065326 | 3/1987 |
| JP | 62-121417 | 6/1987 |
| JP | 62-298728 | 12/1987 |
| JP | 63-157419 | 6/1988 |
| JP | 04-196514 | 7/1992 |
| JP | 04-305915 | 10/1992 |
| JP | 04-305917 | 10/1992 |
| JP | 06-124873 | 5/1994 |
| JP | 07-132262 | 5/1995 |
| JP | 07-220990 | 8/1995 |
| JP | 10-228661 | 8/1998 |
| JP | 10-255319 | 9/1998 |
| JP | 10-303114 | 11/1998 |
| JP | 10-340846 | 12/1998 |
| JP | 11-126747 | 5/1999 |
| JP | 11-176727 | 7/1999 |
| JP | 2000-058436 | 2/2000 |
| JP | 2001-091849 | 4/2001 |
| JP | 2004-193252 | 7/2004 |
| WO | 99/49504 | 9/1999 |
| WO | 03/077036 | 9/2003 |
| WO | 03/077037 | 9/2003 |
| WO | 2004/019128 | 3/2004 |
| WO | 2004/053596 A2 | 6/2004 |
| WO | 2004/053950 A1 | 6/2004 |
| WO | 2004/053951 A1 | 6/2004 |
| WO | 2004/053952 A1 | 6/2004 |
| WO | 2004/053953 A1 | 6/2004 |
| WO | 2004/053954 A1 | 6/2004 |
| WO | 2004/053955 A1 | 6/2004 |
| WO | 2004/053956 A1 | 6/2004 |
| WO | 2004/053957 A1 | 6/2004 |
| WO | 2004/053958 A1 | 6/2004 |
| WO | 2004/053959 A1 | 6/2004 |
| WO | 2004/055803 A1 | 7/2004 |
| WO | 2004/057589 A1 | 7/2004 |
| WO | 2004/057590 A1 | 7/2004 |

OTHER PUBLICATIONS

M. Switkes et al., "Immersion Lithography at 157 nm", J. Vac. Sci. Technol. B., vol. 19, No. 6, Nov./Dec. 2001, pp. 2353-2356.

M. Switkes et al., "Immersion Lithography: Optics for the 50 nm Node", 157 Anvers-1, Sep. 4, 2002.

B.J. Lin, "Drivers, Prospects and Challenges for Immersion Lithography", TSMC, Inc., Sep. 2002.

B.J. Lin, "Proximity Printing Through Liquid", IBM Technical Disclosure Bulletin, vol. 20, No. 11B, Apr. 1978, p. 4997.

B.J. Lin, "The Paths to Subhalf-Micrometer Optical Lithography", SPIE vol. 922, Optical/Laser Microlithography (1988), pp. 256-269.

G.W.W. Stevens, "Reduction of Waste Resulting from Mask Defects", Solid State Technology, Aug. 1978, vol. 21 008, pp. 68-72.

S. Owa et al., "Immersion Lithography; its potential performance and issues", SPIE Microlithography 2003, 5040-186, Feb. 27, 2003.

S. Owa et al., "Advantage and Feasibility of Immersion Lithography", Proc. SPIE 5040 (2003).

Nikon Precision Europe GmbH, "Investor Relations—Nikon's Real Solutions", May 15, 2003.

(56) References Cited

OTHER PUBLICATIONS

H. Kawata et al., "Optical Projection Lithography using Lenses with Numerical Apertures Greater than Unity", Microelectronic Engineering 9 (1989), pp. 31-36.

J.A. Hoffnagle et al., "Liquid Immersion Deep-Ultraviolet Interferometric Lithography", J. Vac. Sci. Technol. B., vol. 17, No. 6, Nov./Dec. 1999, pp. 3306-3309.

B.W. Smith et al., "Immersion Optical Lithography at 193nm", Future FAB International, vol. 15, Jul. 11, 2003.

H. Kawata et al., "Fabrication of 0.2μm Fine Patterns Using Optical Projection Lithography with an Oil Immersion Lens", Jpn. J. Appl. Phys. vol. 31 (1992), pp. 4174-4177.

G. Owen et al., "1/8μm Optical Lithography", J. Vac. Sci. Technol. B., vol. 10, No. 6, Nov./Dec. 1992, pp. 3032-3036.

H. Hogan, "New Semiconductor Lithography Makes a Splash", Photonics Spectra, Photonics TechnologyWorld, Oct. 2003 Edition, pp. 1-3.

S. Owa and N. Nagasaka, "Potential Performance and Feasibility of Immersion Lithography", NGL Workshop 2003, Jul. 10, 2003, Slide Nos. 1-33.

S. Owa et al., "Update on 193nm immersion exposure tool", Litho Forum, International SEMATECH, Los Angeles, Jan. 27-29, 2004, Slide Nos. 1-51.

H. Hata, "The Development of Immersion Exposure Tools", Litho Forum, International SEMATECH, Los Angeles, Jan. 27-29, 2004, Slide Nos. 1-22.

T. Matsuyama et al., "Nikon Projection Lens Update", SPIE Microlithography 2004, 5377-65, Mar. 2004.

"Depth-of-Focus Enhancement Using High Refractive Index Layer on the Imaging Layer", IBM Technical Disclosure Bulletin, vol. 27, No. 11, Apr. 1985, p. 6521.

A. Suzuki, "Lithography Advances on Multiple Fronts", EEdesign, EE Times, Jan. 5, 2004.

B. Lin, The $k_3$ coefficient in nonparaxial $\lambda$/NA scaling equations for resolution, depth of focus, and immersion lithography, J. Microlith., Microfab., Microsyst. 1(1):7-12 (2002).

European Search Report for EP 03255228.3, dated Jul. 12, 2004.

Japanese Official Action issued for Japanese Patent Application No. 2004-215042, dated Jun. 12, 2007.2322.

Chinese Office Action dated Oct. 25, 2011 in corresponding Chinese Patent Application No. 200910211515.5.

Chinese Office Action dated Apr. 14, 2011 in corresponding Chinese Patent Application No. 200910211515.5.

\* cited by examiner

LITHOGRAPHIC APPARATUS AND DEVICE MANUFACTURING METHOD

This application is a continuation of U.S. patent application Ser. No. 14/941,320, filed Nov. 13, 2015, now allowed, which is a continuation of U.S. patent application Ser. No. 14/262,295, filed Apr. 25, 2014, now U.S. Pat. No. 9,213,247, which is a continuation application of U.S. patent application Ser. No. 12/478,552, filed Jun. 4, 2009, now U.S. Pat. No. 8,711,333, which is a continuation application of U.S. patent application Ser. No. 11/641,730, filed Dec. 20, 2006, now U.S. Pat. No. 7,557,901, which is a continuation of U.S. patent application Ser. No. 10/888,514, filed Jul. 12, 2004, now U.S. Pat. No. 7,184,122, which claims priority from European patent application EP 03255228.3, filed Jul. 24, 2003, each of the foregoing applications incorporated herein in their entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein.

However, submersing the substrate or substrate and substrate table in a bath of liquid (see for example U.S. Pat. No. 4,509,852, hereby incorporated in its entirety by reference) means that there is a large body of liquid that must be accelerated during a scanning exposure. This requires additional or more powerful motors and turbulence in the liquid may lead to undesirable and unpredictable effects.

One of the solutions proposed is for a liquid supply system to provide liquid on only a localized area of the substrate and in between the final element of the projection system and the substrate (the substrate generally has a larger surface area than the final element of the projection system). One way which has been proposed to arrange for this is disclosed in PCT patent application WO 99/49504, hereby incorporated in its entirety by reference. As illustrated in FIGS. 2 and 3, liquid is supplied by at least one inlet IN onto the substrate, preferably along the direction of movement of the substrate relative to the final element, and is removed by at least one outlet OUT after having passed under the projection system. That is, as the substrate is scanned beneath the element in a −X direction, liquid is supplied at the +X side of the element and taken up at the −X side. FIG. 2 shows the arrangement schematically in which liquid is supplied via inlet IN and is taken up on the other side of the element by outlet OUT which is connected to a low pressure source. In the illustration of FIG. 2 the liquid is supplied along the direction of movement of the substrate relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element.

A conventional lithographic projection apparatus requires one or more sensors on the substrate table so that, for example, the substrate table which carries the substrate can be correctly positioned relative to the projection beam. These sensors typically include a Transmission Image Sensor (TIS) which is a sensor that is used to measure the position at substrate level of a projected aerial image of a mark pattern at the reticle level (mask). Typically, the projected image at substrate level is a line pattern with a line width similar to projection beam wavelength. The TIS measures these mask patterns by using a transmission pattern with a radiation sensor underneath. The sensor data is used to measure the position of the mask with respect to the position of the substrate table in six degrees of freedom. Also the magnification and scaling of the projected mask pattern are measured, since four points on the mask are used for the measurement. As the sensor should also be capable of measuring the pattern positions and influences of all illumination settings (sigma, projection system NA, all masks (binary, PSM, . . . )), a small line width is required. Furthermore, the sensor is also used to measure/monitor the optical performance of the apparatus. Different measurements are implemented for measuring pupil shapes, coma, spherical aberration, astigmatism and field curvature. For these measurements, different illumination settings are used in combination with different projected images. Also such a sensor may be an Integrated Lens Interferometer At Scanner (ILIAS) which is an interferometric wavefront measurement system implemented on lithography tools. ILIAS performs (static) measurements on lens aberrations (up to Zernicke 36) as are needed for system setup and qualification. ILIAS is an on scanner integrated measurement system used for system setup and calibration. ILIAS is used for monitoring and recalibration of the scanner on a regular basis depending on the machine needs. Also, such a sensor may be a dose (spot) sensor or any other type of sensor that may be used at substrate level. All of these sensors are used at substrate level and as such are positioned on the substrate table. In order to avoid the need to perform complex predictions about how the immersion liquid will affect the projection beam, it is desirable to illuminate the one or more sensors under the same conditions as the substrate is to be imaged, i.e. with immersion liquid in place between the projection system and the sensor.

Sensors of the type mentioned above used in conventional lithographic projection apparatus typically have an absorption layer positioned over a grating in front of the actual radiation sensor. The absorbing layer is used to ensure that the sensor is a high contrast sensor so that accurate readings can be made. The absorbing layer has open and closed areas to get a high signal contrast between the radiation transmitted through the open patterns and the closed absorbing area. The photo sensor below the absorbing layer is normally much larger than the open patterns in order to measure the radiation for large angles. The ratio of the open pattern area versus the radiation sensitive area in a typical sensor is roughly (1:5600). So it is often important to absorb as much radiation as possible using an absorbing layer on the closed areas above the radiation sensor. Area patterns with a line width of the order of 200 nm are used. To implement this, a multi-layer structure is used so that the required resolution can easily be achieved. Typically the absorption elements of such sensors are made of a plurality of layers of different metal types. Chromium is the most widely used because it is common in mask production, and has good absorbing properties for blocking ultra-violet and deep ultra-violet radiation. Aluminum is also used because it has good etch selectivity with respect to chromium and a good optical density. Other metals, both elemental and alloys, may be suitable. Metals are typically used because of their good electrical conductivity and optical reflectivity which is useful for substrate table height measurements.

In U.S. Pat. No. 5,825,043, sensors are arranged above the substrate table relying on reflection of radiation off the surface of the substrate table to avoid making sensors resistant to liquid. However, this may result in a loss in accuracy.

SUMMARY

Accordingly, it would be advantageous, for example, to provide accurate sensors for use in an immersion lithographic projection apparatus.

According to an aspect, there is provided a lithographic projection apparatus arranged to project, using a projection system, a pattern from a patterning device onto a substrate held by a substrate table, comprising:

a liquid supply system configured to provide a liquid to a space between the projection system and the substrate; and a sensor mounted on the substrate table and configured to be exposed by radiation, the sensor including a surface that is to be in contact with liquid from the liquid supply system during exposure of the sensor by radiation, the surface comprising one or fewer metal types.

In an immersion lithographic apparatus, formation of a galvanic cell between two dissimilar metal types when in contact with liquid may be prevented or limited, particularly when the immersion liquid is water or water based. This may allow a sensor to be positioned on the substrate table in an immersion lithographic apparatus. For example, because of the required small size of the features of a sensor, if a galvanic cell is allowed to be established, the effectiveness of that sensor may quickly decrease as a surface of a metal type dissolves away. Thus, avoiding or limiting the establishment of a galvanic cell, a high contrast sensor may be achieved which provides a long service lifetime in an immersion environment.

In an embodiment, the surface is formed by a continuous layer of one metal type. By having a layer of one metal type, the use of two metals is avoided so that even with minor damage to the continuous layer a galvanic cell will not be established. Areas of different absorption characteristics may be provided by having the layer not be uniform in thickness.

In an embodiment, the sensor may comprise a layer of an isolation material. The isolation material may provide a convenient way to provide that different metal types are electrically insulated from one another or isolated from the immersion liquid. In an implementation, the layer is continuous but need not be where the two metal types are insulated from one another or isolated from the immersion liquid.

In an embodiment, the sensor comprises a layer of metal which is not of uniform thickness. In that embodiment, the surface may comprise areas of the layer of isolation material and areas of the layer of metal, which is of one metal type.

If the layer of metal comprises two layers of metal, each of a different metal type, then the layer of isolation material may be sandwiched between the two layers, each of a different metal type. Also, where the two layers of metal are in contact, the layer of isolation material may form a surface to be in contact with the liquid. In an embodiment, the isolation material comprises an electrical insulation material.

In an embodiment, the surface is formed of a layer of one metal type and the sensor comprises a further layer of a material other than metal. The material other than metal may be a ceramic.

In an embodiment, the sensor may comprise an absorption element with areas of different absorption characteristics and the surface is formed by the absorption element.

According to a further aspect, there is provided a device manufacturing method comprising:

projecting a patterned beam of radiation onto a substrate through a liquid in a space between a projection system of a lithographic apparatus and a substrate; and illuminating a sensor on a substrate table after providing a liquid between the projection system and the sensor, wherein the sensor includes a surface in contact with the liquid being formed of one or fewer metal types.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Embodiment 1

Figure 1:
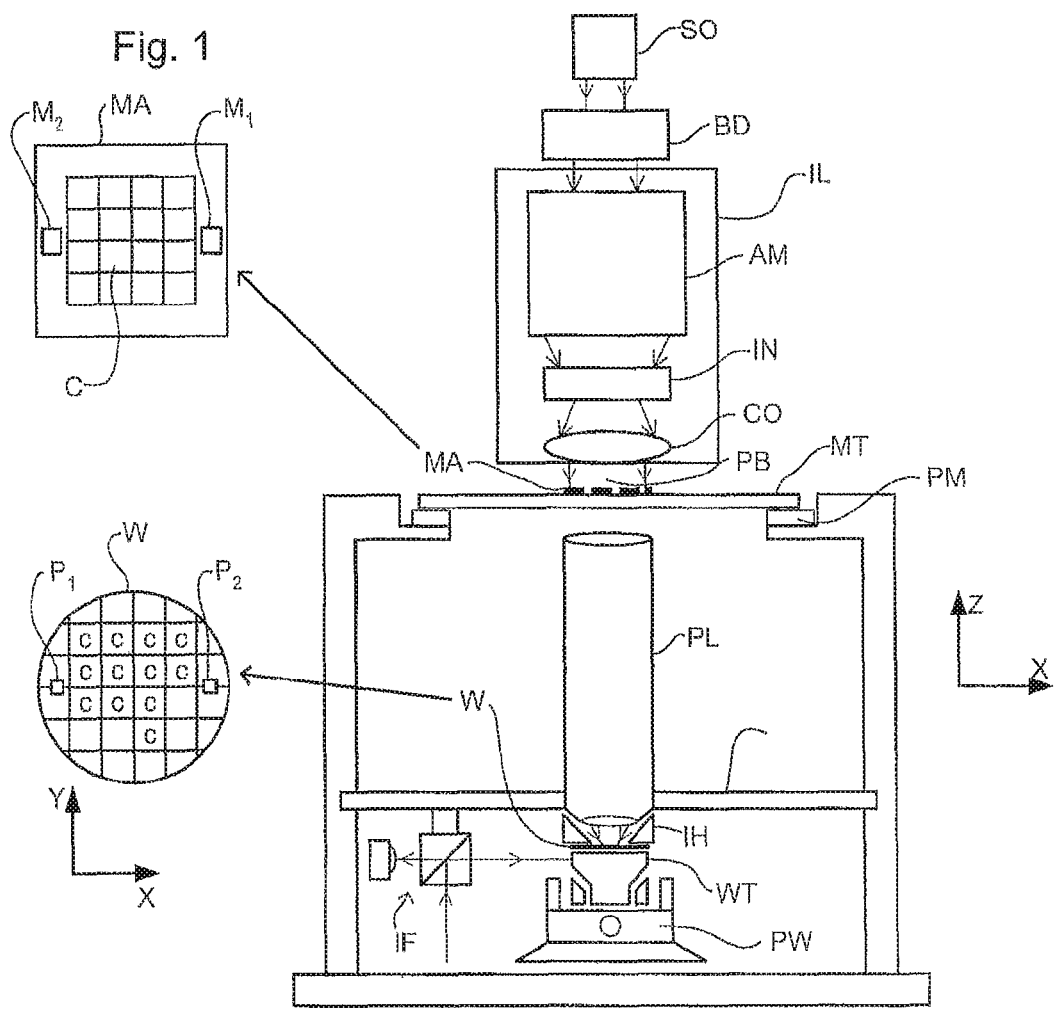
FIG. 1 depicts a lithographic apparatus according to an embodiment of the invention.

FIG. 1 schematically depicts a lithographic apparatus according to one embodiment of the invention. The apparatus comprises:

- an illumination system (illuminator) IL configured to condition a radiation beam PB (e.g. UV radiation or DUV radiation).
- a support structure (e.g. a mask table) MT constructed to support a patterning device (e.g. a mask) MA and connected to a first positioner PM configured to accurately position the patterning device in accordance with certain parameters;
- a substrate table (e.g. a wafer table) WT constructed to hold a substrate (e.g. a resist-coated wafer) W and connected to a second positioner PW configured to accurately position the substrate in accordance with certain parameters; and
- a projection system (e.g. a refractive projection lens system) PL configured to project a pattern imparted to the radiation beam PB by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AM for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam PB is incident on the patterning device (e.g., mask) MA, which is held on the support structure (e.g., mask table) MT, and is patterned by the patterning device. Having traversed the patterning device MA, the radiation beam PB passes through the projection system PL, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam PB. Similarly, the first positioner PM and another position sensor (which is not explicitly depicted in FIG. 1) can be used to accurately position the patterning device MA with respect to the path of the radiation beam PB, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 5:
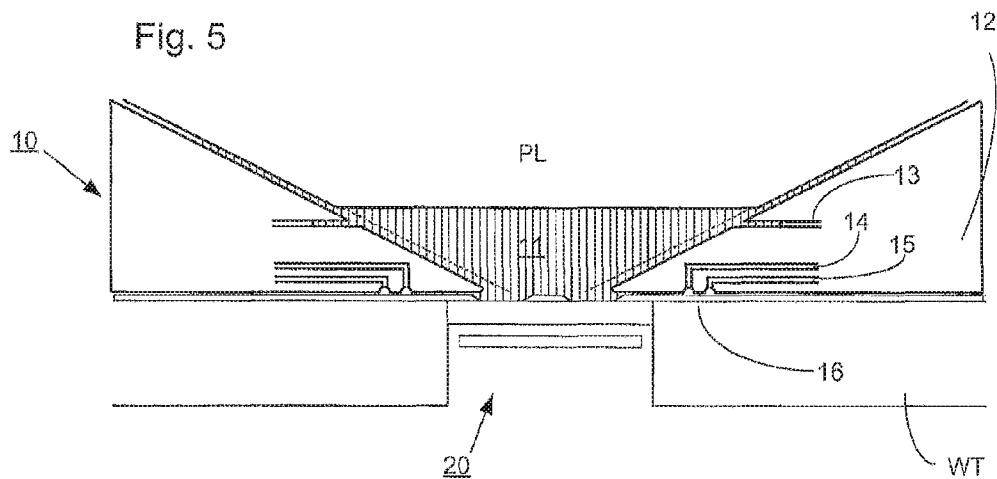
FIG. 5 illustrates another liquid supply system as well as a sensor according to an embodiment of the present invention.

FIG. 5 shows a liquid reservoir 10 between the projection system PL and a sensor 20 which is positioned on the substrate stage WT. The liquid reservoir 10 is filled with a liquid 11 having a relatively high refractive index, e.g. water, provided via inlet/outlet ducts 13. The liquid has the effect that the radiation of the projection beam is a shorter wavelength in the liquid than in air or in a vacuum, allowing smaller features to be resolved. It is well known that the resolution limit of a projection system is determined, inter alia, by the wavelength of the projection beam and the numerical aperture of the system. The presence of the liquid may also be regarded as increasing the effective numerical aperture. Furthermore, at fixed numerical aperture, the liquid is effective to increase the depth of field.

In an embodiment, the reservoir 10 forms a contactless seal to the substrate around the image field of the projection system PL so that the liquid is confined to fill the space between the substrate's primary surface, which faces the projection system PL, and the final optical element of the projection system PL. The reservoir is formed by a seal member 12 positioned below and surrounding the final element of the projection system PL. Thus, the liquid supply system provides liquid on only a localized area of the substrate. The seal member 12 forms part of the liquid supply system for filling the space between the final element of the projection system and the sensor 20 (or substrate) with a liquid. This liquid is brought into the space below the projection system and within the seal member 12. The seal member 12 extends a little above the bottom element of the projection system and the liquid rises above the final element so that a buffer of liquid is provided. The seal member 12 has an inner periphery that at the upper end closely conforms to the shape of the projection system or the final elements thereof and may, e.g. be round. At the bottom the inner periphery forms an aperture which closely conforms to the shape of the image field, e.g. rectangular, though this is not necessarily so. The projection beam passes through this aperture.

Figure 2:
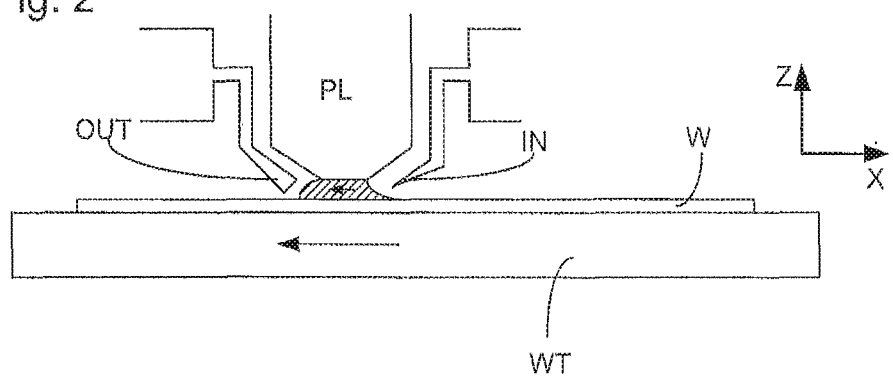
FIGS. 2 and 3 depict a liquid supply system in a lithographic projection apparatus.

The liquid 11 is confined in the reservoir 10 by a seal device 16. As illustrated in FIG. 2, the seal device is a contactless seal, i.e. a gas seal. The gas seal is formed by gas, e.g. air or synthetic air, provided under pressure via inlet 15 to the gap between seal member 12 and substrate W and extracted by first outlet 14. The over pressure on the gas inlet 15, vacuum level on the first outlet 14 and the geometry of the gap are arranged so that there is a high-velocity gas flow inwards towards the optical axis of the apparatus that confines the liquid 11. As with any seal, some liquid is likely to escape, for example up the first outlet 14.

Figure 3:
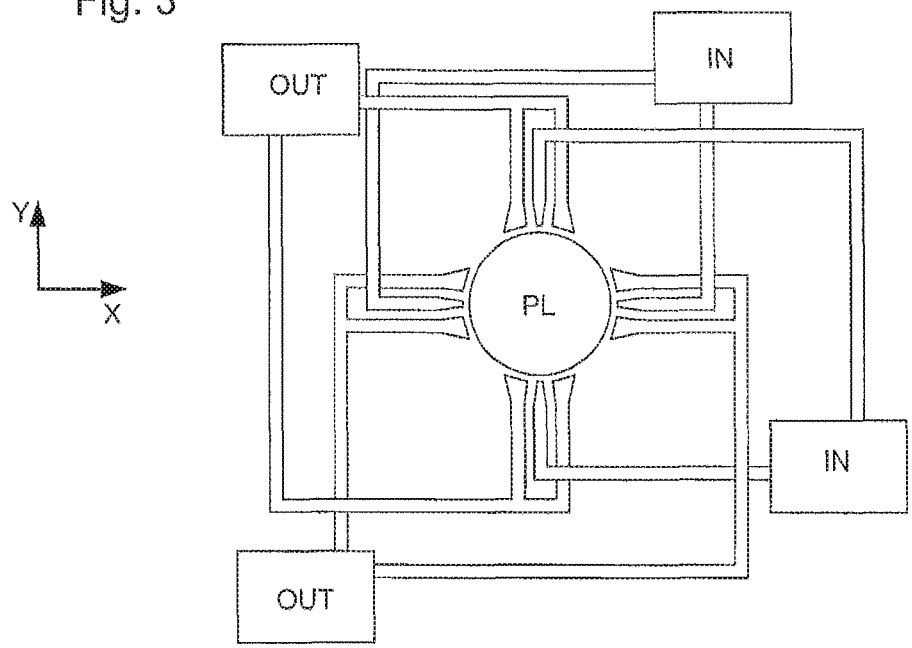
Figure 4:
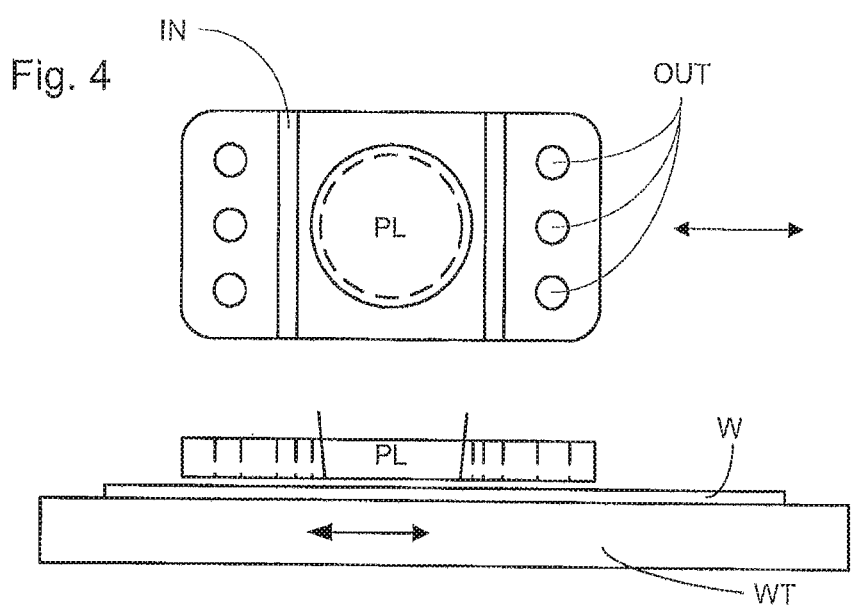
FIG. 4 depicts another liquid supply system in a lithographic projection apparatus.

FIGS. 2 to 4 also depict a liquid reservoir defined by inlet(s) IN, outlet(s) OUT, the substrate W and the final element of projection system PL. Like the liquid supply system of FIG. 5 the liquid supply systems illustrated in FIGS. 2 to 4, comprising inlet(s) IN and outlet(s) OUT, supplies liquid to a space between the final element of the projection system and a localized area of the primary surface of the substrate.

Figure 6:
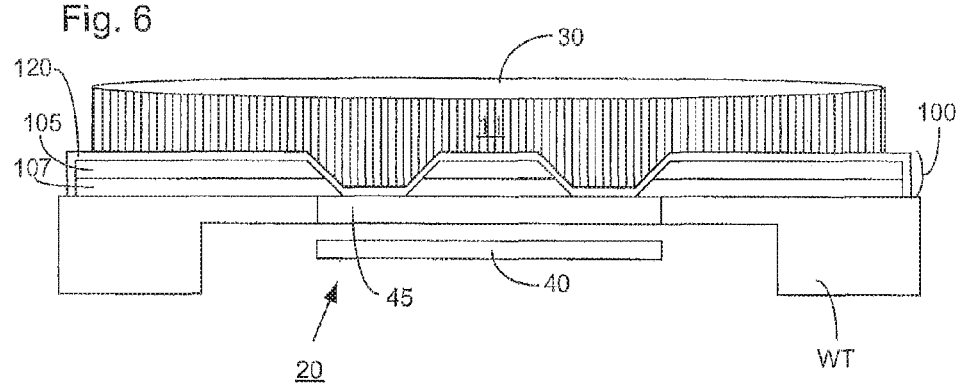
FIG. 6 illustrates a sensor according to the first embodiment of the present invention.

All of the liquid supply systems of FIGS. 2 to 4 and FIG. 5 can be used with the sensor 20 which is illustrated in more detail in FIG. 6. In FIG. 6 the liquid supply system is not illustrated but the final element of the projection system 30 is depicted as is the liquid reservoir, which is filled with immersion liquid 11.

Referring to FIG. 6, the sensor 20 comprises a sensor element detector 40, a transmissive sensor grating 45 and an absorption element 100. The absorption element 100 is used to enhance the sensor contrast and thus the overall sensor performance. The contrast in the sensor due to the absorption element 100 is the ratio of the radiation transmitted through an open area of the pattern in relation to the amount of radiation that is transmitted through the closed area i.e. the areas which are covered. The behavior of the absorption element is mainly driven by the ratio of the open area of the transmissive sensor grating 45 and the area of the absorption element 100 above the sensor element detector 40. For a TIS, the ratio of the open grating area to closed absorbing area is 1:5600. In order to obtain a 0.1% contribution of the radiation transmitted through the absorption element 100 an optical density of $0.001/5600 \sim 2e-7$ is needed.

The transmissive sensor grating 45 is used for convolution of the projected aerial image of a corresponding pattern at reticle level (4 or 5 times larger than the pattern on the sensor). The convolution of the transmissive sensor grating 45 with the projected aerial image of the pattern at reticle level provides an intensity profile depending on the position of the transmission sensor grating 45 at substrate level. With the intensity data at different substrate table positions the position and shape of the aerial image can be calculated.

The sensor element detector 40 transforms the radiation that is transmitted through the open area of the grating into an electrical signal. The total amount of radiation that is transmitted through the grating 45 and the absorption element 100 contributes to the total electrical signal. In order to get a good sensor performance, the amount of radiation that transmits through the absorption element 100 should be minimized (less than 0.1% of the radiation transmitted through the open area). If the optical density of the absorption element 100 is too large, the sensor performance will likely degrade. The purpose of the absorption element 100 is thus to absorb part of the energy of the projection beam PB so that the sensor can achieve sufficient contrast by providing areas of different absorption characteristics.

In an embodiment, the absorption element 100 is made of at least one metal layer (shown in FIG. 6 as two layers 105, 107) such as aluminum and/or chromium (or alloys thereof) but may be made of one or more layers of any metal(s). Al and Cr are particularly efficient at absorbing projection beam radiation and may be advantageous manufacturing and processing resources.

The total thickness of the metal layer(s) is of the order of 200 nm. In an Al/Cr multi-layer, the Al layer should typically be 100 nm and the Cr layer 90 nm thick. The width of the areas not covered is of the order of 100 to 300 nm for TIS and 2-5 µm for ILIAS. A problem with using two layers, each of different metal types in the absorption element, is that a galvanic cell may be set up when the two metal types are in electrical contact and in contact with an electrolyte, i.e., the immersion liquid. In such a galvanic cell the less noble metal (aluminium) reacts as in reaction 1:

$$Al \rightarrow Al^{3+} + 3e^-$$ (reaction 1)

The three electrons generated in reaction 1 move to the chromium-immersion liquid interface where reaction 2 takes place. In the case of an immersion liquid based on water, the reaction is:

$$2H_2O + O_2 + 4e^- \rightarrow 4OH^-$$ (reaction 2)

For immersion liquids other than water, a slightly different reaction takes place. When the foregoing reactions are summed, the following reaction takes place:

$$4Al + 6H_2O + 3O_2 \rightarrow 4Al^{3+} + 12OH^-$$ (reaction 3)

As a rule of thumb, the rate of the overall reaction is influenced, among others, by the metals involved. The closer their positions in the galvanic series, the lower the corrosion rate will be. Metals close to aluminum in the galvanic series, such as zinc or cadmium, typically have drawbacks that may make them not suitable for use in this application to replace the chromium.

In an embodiment, the establishment of such a galvanic cell is prevented or limited by the use of a continuous layer 120 of an isolation material such as $SiO_2$ or SiN typically between 20 and 100 nm in thickness. The layer 120 need not be continuous over areas where only layer 105 would be in contact with the immersion liquid; it need only be continuous where without it, layers 105 and 107 would together come into contact with the immersion liquid. In an implementation, a continuous layer using all of layer 105 is used as it prevents problems with the compatibility of layer 105 with the immersion liquid due to pinholes and scratches in layer 105. The isolation material may either be liquid impermeable (either electrically insulative or conductive) or an electrical insulator and must be sufficiently transparent to the radiation with which the sensor is irradiated. The layer 120 covers both metal layers 105, 107 of the absorption element 100 (i.e. an outer surface of the absorption element 100, which is in contact with the immersion liquid during exposure of the sensor, is formed by the continuous layer) such that a galvanic reaction between the two metal layers or even between two different metal types in a single layer cannot proceed because the second metal layer 107 (the chromium layer) or the two different metal types in a single layer is isolated from the immersion liquid 11 so that reaction 2 cannot proceed.

According to an embodiment, the formation of a galvanic cell between two dissimilar metal types when immersed in immersion liquid can be prevented, particularly when the immersion liquid is water or water based. This allows the sensor to be positioned on the substrate table. Because of the required small size of the features on the absorption element, if a galvanic cell is allowed to be established, the effectiveness of that absorption element will quickly decrease as one of the metal types dissolves away. Thus, a high contrast sensor may be achieved which provides a long service lifetime in an immersion environment.

As used herein, the term metal type means an elemental metal or an alloy. The isolation material provides a convenient way to ensure that different metal types can be electrically insulated from one another or isolated from the immersion liquid.

As will be appreciated, each of the two metal layers 105, 107 may be made of different types of metal and indeed this embodiment can also be used with only a single layer of metal which may be made of one or more types of metal.

Embodiment 2

Figure 7:
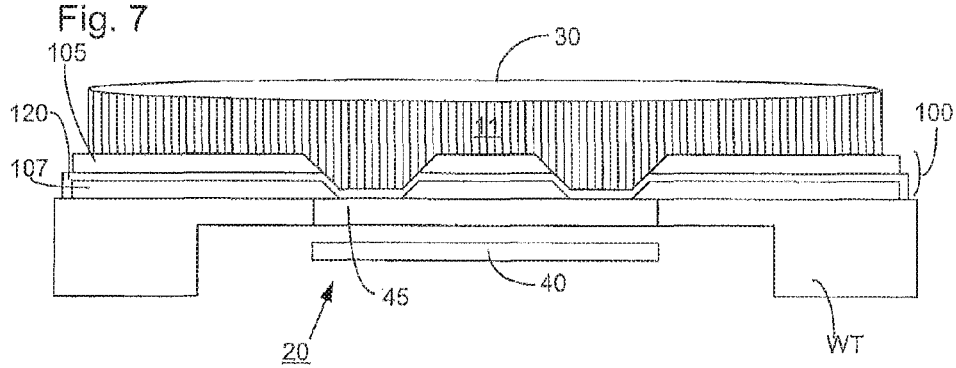
FIG. 7 illustrates a sensor according to a second embodiment of the present invention.

A second embodiment will now be described with reference to FIG. 7 and is the same as the first embodiment except as described below.

In the second embodiment, the absorption element 100 comprises two metal layers 105, 107. However, in the second embodiment, the isolation layer 120 is made of an electrical insulation material and is sandwiched between the first and second layers 105, 107. Again, the isolation layer is only necessary where the stack of layers 105 and 107 would, without it, come into contact with the immersion liquid but, in an implementation, a continuous isolation layer is used to deal with imperfections in layer 105. Thus, the surface of the absorption element 100 is formed partly of the first metal layer 105 and partly of the layer of insulation material 120. In this embodiment the function of the layer of insulation material 120 is to electrically isolate the first and second metal layers 105, 107 from each other such that no galvanic couple exists. In this embodiment, the first metal layer 105 should be made of a single metal type i.e. an elemental metal or an alloy but not of two elemental metals or two alloys which are not fully alloyed. The second metal layer 107 may be made of one or more metal types.

Embodiment 3

Figure 8:
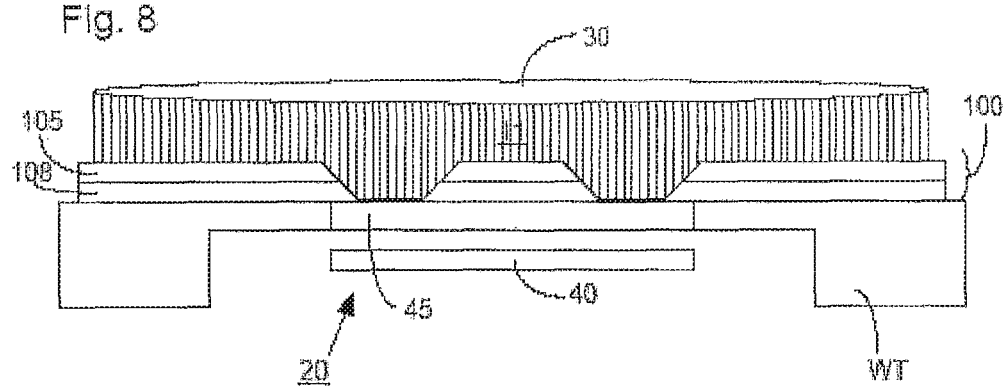
FIG. 8 illustrates a sensor according to a third embodiment of the present invention.

A third embodiment will now be described with reference to FIG. 8 and is the same as the first embodiment save as described below.

In the third embodiment, there is no layer of insulation material 120. There are two layers 105, 108, one of which is a metal layer 105, for example Cr, and another of which is a non-metal layer 108, such as a ceramic, for example a metal carbide or nitride such as TiN. The layers 105, 108 may be either way around. This combination also has good resistance to galvanic corrosion and has an advantage of being easy to manufacture as each layer needs only to be about 100 nm thick.

Embodiment 4

Figure 9:
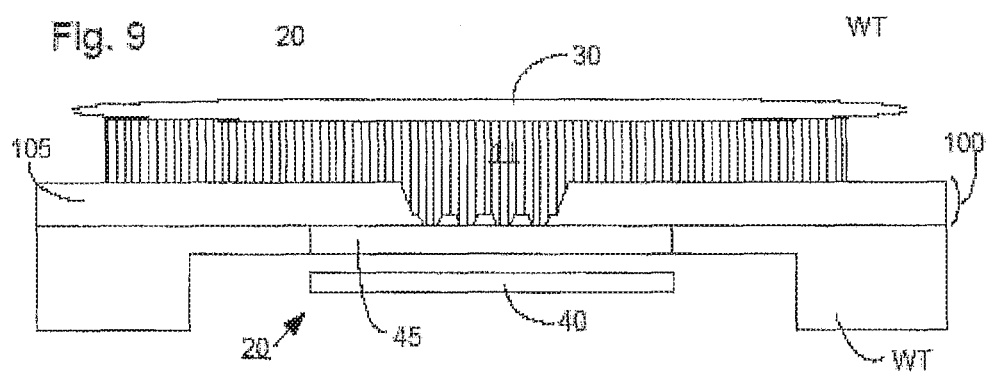
FIG. 9 illustrates a sensor according to a fourth embodiment of the present invention.
Figure 9A:
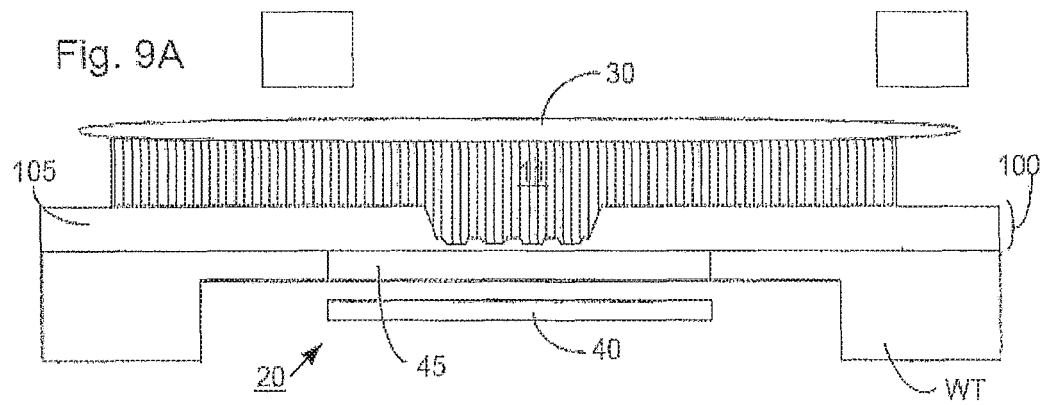
FIG. 9A illustrates a further sensor according to a fourth embodiment of the invention.

A fourth embodiment will now be described with reference to FIGS. 9 and 9A and is the same as the first embodiment except as described below.

In the fourth embodiment, the formation of a galvanic couple is prevented or limited by the use of only one metal type in the absorption element 100. The single metal type may be deposited in a layer 105. The areas of different absorption characteristics are formed by depositing the metal layer 105 in different thicknesses (as shown in FIG. 9A as a continuous layer), which includes areas where the layer is not deposited at all (as shown in FIG. 9), so that the thickness of the layer 105 is not uniform. As only one metal type is exposed to the immersion liquid, no galvanic couple exists. Thus, the use of two metals in the absorption element is completely avoided so that even with minor damage to the continuous layer a galvanic cell will not be established.

In the above described embodiments, the metal layers 105, 107 may be of various thicknesses over the area of the sensor. The variation thicknesses include areas where the layer is not deposited at all (as in FIGS. 6, 7 and 8). The first and second embodiments have been described with the metal layers either in existence in a given area at a certain thickness, or not existent in an area at all; this need not be the case and the thicknesses of the layers may vary over the area of the sensor.

In an embodiment, the transmissive sensor grating 45 and the substrate table WT are made of non conductive materials. This has an advantageous as a galvanic couple cannot then be set up between the metal layers 105, 107 deposited on the substrate table WT or transmissive sensor grating 45 and other metals which are also in contact with the immersion liquid.

The above described methods of avoiding the formation of galvanic cells can be applied to any parts of any sensors or other devices which are immersed in immersion liquid.

Embodiments are described in the following number clauses:

1. A lithographic projection apparatus arranged to project, using a projection system, a pattern from a patterning device onto a substrate held by a substrate table, comprising: a liquid supply system configured to provide a liquid to a space between the projection system and the substrate; and a sensor mounted on the substrate table and configured to be exposed to electromagnetic radiation, the sensor including a surface that is to be in contact with liquid from the liquid supply system, the surface comprising no more than one metal type.

2. The lithographic projection apparatus according to clause 1, wherein the surface is formed by a continuous layer of one metal type.

3. The lithographic projection apparatus according to clause 2, wherein the continuous layer is not uniform in thickness to provide areas with different absorption characteristics.

4. The lithographic projection apparatus according to clause 1, wherein the surface comprises a layer of one metal type and the sensor comprises a further layer of a material other than metal.

5. The lithographic projection apparatus according to clause 4, wherein the material other than metal comprises a ceramic.

6. The lithographic projection apparatus according to clause 1, wherein the sensor comprises a layer of an isolation material.

7. The lithographic projection apparatus according to clause 6, wherein the sensor comprises a layer of metal which is not of uniform thickness.

8. The lithographic projection apparatus according to clause 7, wherein the surface comprises areas of the layer of isolation material and areas of the layer of metal, which is of one metal type.

9. The lithographic projection apparatus according to clause 7, wherein the layer of metal comprises two layers of metal, each of a different metal type.

10. The lithographic projection apparatus according to clause 9, wherein the two layers of metal are in contact and the layer of isolation material forms a surface to be in contact with the liquid.

11. The lithographic projection apparatus according to clause 10, wherein the isolation material comprises an electrical insulation material.

12. The lithographic projection apparatus according to clause 10, wherein the layer of isolation material blocks the two layers of metal from contact with the liquid.

13. The lithographic projection apparatus according to clause 9, wherein the layer of isolation material is sandwiched between the two layers of metal.

14. The lithographic projection apparatus according to clause 13, wherein the isolation material comprises an electrical insulation material.

15. The lithographic projection apparatus according to clause 10, wherein the layer of isolation material blocks one of the layers of metal from contact with the liquid.

16. The lithographic projection apparatus according to clause 1, wherein the sensor comprises an absorption element with areas of different absorption characteristics and the surface is formed by the absorption element.

17. A device manufacturing method, comprising: projecting a patterned beam of radiation onto a substrate through a liquid in a space between a projection system of a lithographic apparatus and a substrate; and providing a liquid between the projection system and a sensor on a substrate table, the sensor configured sense electromagnetic radiation and including a surface, in contact with the liquid, formed of no more than one metal type.

18. The method according to clause 17, wherein the sensor comprises a layer of an isolation material.

19. The method according to clause 18, wherein the sensor comprises a layer of metal comprising two layers of metal, each of a different metal type.

20. The method according to clause 19, wherein the two layers of metal are in contact and the layer of isolation material forms a surface to be in contact with the liquid.

21. The method according to clause 20, wherein the layer of isolation material blocks the two layers of metal from contact with the liquid.

22. The method according to clause 19, wherein the layer of isolation material is sandwiched between the two layers of metal.

23. The method according to clause 22, wherein the isolation material comprises an electrical insulation material.

24. The method according to clause 22, wherein the layer of isolation material blocks one of the layers of metal from contact with the liquid.

25. The method according to clause 17, wherein the sensor comprises a layer of metal which is not of uniform thickness.

Another liquid supply system which has been proposed is to provide the liquid supply system with a seal member which extends along at least a part of a boundary of the space between the final element of the projection system and the substrate table. The seal member is substantially stationary relative to the projection system in the XY plane though there may be some relative movement in the Z direction (in the direction of the optical axis). A seal is formed between the seal member and the surface of the substrate. In an embodiment, the seal is a contactless seal such as a gas seal. Such a system with a gas seal is disclosed in U.S. patent application U.S. Ser. No. 10/705,783, hereby incorporated in its entirety by reference.

A further immersion lithography solution with a localized liquid supply system is shown in FIG. 4. Liquid is supplied by two groove inlets IN on either side of the projection system PL and is removed by a plurality of discrete outlets OUT arranged radially outwardly of the inlets IN. The inlets IN and OUT can be arranged in a plate with a hole in its center and through which the projection beam is projected. Liquid is supplied by one groove inlet IN on one side of the projection system PL and removed by a plurality of discrete outlets OUT on the other side of the projection system PL, causing a flow of a thin film of liquid between the projection system PL and the substrate W. The choice of which combination of inlet IN and outlets OUT to use can depend on the direction of movement of the substrate W (the other combination of inlet IN and outlets OUT being inactive).

In European Patent Application No. 03257072.3, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

The present invention can be applied to any immersion lithography apparatus, in particular, but not exclusively, those types mentioned above.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, an embodiment of the invention may take the form of a computer program containing one or more sequences of machine-readable instructions describing a method as disclosed above, or a data storage medium (e.g. semiconductor memory, magnetic or optical disk) having such a computer program stored therein. The descriptions above are intended to be illustrative, not limiting. Thus, it will be apparent to one skilled in the art that modifications may be made to the invention as described without departing from the scope of the claims set out below.

The invention claimed is:

1. A lithographic projection apparatus comprising:
   a projection system configured to project a beam of radiation from a patterning device onto a substrate;
   a liquid supply system configured to provide a liquid to a space between the projection system and an object facing the projection system; and
   a movable table comprising:
      a sensor system component configured to be exposed to electromagnetic radiation, the sensor system component located or locatable below the projection system and the sensor system comprising an essentially opaque surface comprising an aperture through which the electromagnetic radiation passes to a surface located below the aperture and above which the liquid from the liquid supply system is to be provided, and
      a liquid impermeable layer spanning at least the aperture through which the electromagnetic radiation passes to the surface below the liquid impermeable layer, the liquid impermeable layer preventing the surface from contact with liquid contacting the liquid impermeable layer.

2. The lithographic projection apparatus of claim 1, wherein the essentially opaque surface comprises a layer of metal with the aperture.

3. The lithographic projection apparatus of claim 2, wherein at least part of the liquid impermeable layer is within the aperture.

4. The lithographic projection apparatus of claim 2, wherein the liquid impermeable layer overlies at least part of the layer of metal.

5. The lithographic projection apparatus of claim 1, wherein the liquid impermeable layer is spaced apart from the surface.

6. The lithographic projection apparatus of claim 1, wherein the essentially opaque surface is in direct contact with the liquid impermeable layer.

7. The lithographic projection apparatus of claim 1, comprising a grating and the liquid impermeable layer overlies at least part of the grating.

8. The lithographic projection apparatus of claim 1, wherein the surface comprises a detection surface of a detector.

9. A device manufacturing method, comprising:
projecting a beam of radiation onto a radiation-sensitive substrate through liquid in a space between a projection system of a lithographic apparatus and the substrate;
providing a liquid between the projection system and a sensor system component in or on a movable table located below the projection system, the sensor system component comprising an essentially opaque surface comprising an aperture through which electromagnetic radiation can pass to a surface located below the aperture and above which the liquid from the liquid supply system is provided, and a liquid impermeable layer spanning at least the aperture; and
passing electromagnetic radiation through the liquid impermeable layer to the surface below the liquid impermeable layer, the liquid impermeable layer preventing the surface from contact with liquid contacting the liquid impermeable layer.

10. The method according to claim 9, comprising passing the electromagnetic radiation to a grating, the liquid impermeable layer overlying at least part of the grating.

11. The method according to claim 9, comprising passing the electromagnetic radiation through an aperture of a layer of metal onto the surface.

12. The method according to claim 11, wherein the liquid impermeable layer at least partially overlies the layer of metal.

13. The method according to claim 9, wherein the surface comprises a detection surface of a detector and comprising detecting the electromagnetic radiation using the detector.

14. A lithographic projection apparatus comprising:
a projection system configured to project a beam of radiation from a patterning device onto a substrate;
a liquid supply system configured to provide a liquid to a space between the projection system and an object facing the projection system; and
a movable table comprising:
a sensor system component configured to be exposed to electromagnetic radiation, the sensor system component located or locatable below the projection system and comprising a grating structure above which the liquid from the liquid supply system is to be provided, and
a liquid impermeable layer through which the electromagnetic radiation passes to the grating structure below the liquid impermeable layer, the liquid impermeable layer at least in part preventing at least part of the grating structure from contact with liquid on the liquid impermeable layer.

15. The lithographic projection apparatus of claim 14, wherein the grating structure comprises a layer of metal having an aperture to receive the electromagnetic radiation, wherein at least part of the liquid impermeable layer spans the aperture.

16. The lithographic projection apparatus of claim 14, wherein the grating structure comprises a layer of metal having an aperture to receive the electromagnetic radiation, wherein at least part of the liquid impermeable layer overlies at least part of layer of metal.

17. The lithographic projection apparatus of claim 16, wherein the layer of metal is in contact with the liquid impermeable layer.

18. The lithographic projection apparatus of claim 14, wherein the grating structure comprises an aperture to pass the electromagnetic radiation to a surface, wherein the structure blocks passage of the liquid through the aperture to the surface.

19. The lithographic projection apparatus of claim 18, wherein the surface comprises a detection surface of a detector.

20. The lithographic projection apparatus of claim 19, wherein the liquid impermeable layer is spaced apart from the surface.

* * * * *